(12) United States Patent
Lu et al.

(10) Patent No.: US 7,029,929 B1
(45) Date of Patent: Apr. 18, 2006

(54) METHOD OF MANUFACTURING SEMICONDUCTOR DEVICES USING A BOND PROGRAM VERIFICATION SYSTEM

(75) Inventors: Qin Lu, Singapore (SG); Soo Yeow Heng, Singapore (SG); Tian Han Lim, Singapore (SG); Gunasekaran Natarajan, Singapore (SG); Eng Seng Ong, Singapore (SG)

(73) Assignee: National Semiconductor Corporation, Santa Clara, CA (US)

( * ) Notice: Subject to any disclaimer, the term of this patent is extended or adjusted under 35 U.S.C. 154(b) by 149 days.

(21) Appl. No.: 10/897,520

(22) Filed: Jul. 22, 2004

Related U.S. Application Data

(62) Division of application No. 09/947,339, filed on Sep. 5, 2001, now Pat. No. 6,789,235.

(51) Int. Cl.
*H01L 21/60* (2006.01)
*G06F 17/50* (2006.01)

(52) U.S. Cl. .............................. 438/7; 438/16; 438/617; 716/4

(58) Field of Classification Search .................... 438/7, 438/16, 617; 382/146; 348/87, 126, 190; 716/5, 9
See application file for complete search history.

(56) References Cited

U.S. PATENT DOCUMENTS

| | | | |
|---|---|---|---|
| 4,010,885 A | 3/1977 | Keizer et al. ............... 228/6 A |
| 4,953,006 A | 8/1990 | Kovats ......................... 357/80 |
| 5,007,097 A | 4/1991 | Mizuoka et al. ............... 382/8 |
| 5,012,673 A | 5/1991 | Takano et al. ............. 73/118.1 |
| 5,119,436 A | 6/1992 | Holdgrafer ..................... 382/8 |
| 5,549,716 A | 8/1996 | Takahashi et al. ......... 29/25.01 |
| 5,757,956 A | 5/1998 | Koljonen et al. ........... 382/151 |
| 6,054,767 A | 4/2000 | Chia et al. .................. 257/738 |
| 6,516,447 B1 | 2/2003 | Wadland et al. ............... 716/1 |
| 6,538,898 B1 | 3/2003 | Prindivill et al. ........... 361/760 |
| 6,555,401 B1 | 4/2003 | Koduri ........................ 438/18 |
| 2001/0006041 A1 | 7/2001 | Wensel ....................... 118/300 |
| 2003/0192019 A1 | 10/2003 | Goto et al. ..................... 716/5 |

*Primary Examiner*—George Fourson
(74) *Attorney, Agent, or Firm*—Beyer Weaver & Thomas LLP

(57) ABSTRACT

A method for checking a wire bonding recipe is provided. Generally, coordinate data of a master recipe is stored. Coordinate data of a slave recipe is stored. The coordinate data of the slave recipe is compared with coordinate data of the master recipe. An error signal is provided if a mismatch is found between the coordinate data of the slave recipe and the coordinate data of the master recipe.

A computer readable medium containing program instructions for checking a wire bonding recipe is also provided. The program contains computer readable code for storing coordinate data of a master recipe, computer readable code for storing coordinate data of a slave recipe, computer readable code for comparing the coordinate data of the slave recipe with coordinate data of the master recipe, and computer readable code for providing an error signal if a mismatch is found between the coordinate data of the slave recipe and the coordinate data of the master recipe.

10 Claims, 7 Drawing Sheets

METHOD OF MANUFACTURING SEMICONDUCTOR DEVICES USING A BOND PROGRAM VERIFICATION SYSTEM

RELATED APPLICATIONS

This application is a Divisional application of prior U.S. application Ser. No. 09/947,339, entitled "BOND PROGRAM VERIFICATION SYSTEM", filed on Sep. 5, 2001, which is incorporated by reference now U.S. Pat. No. 6,789,235.

FIELD OF THE INVENTION

The present invention relates generally to semiconductor devices. More specifically, the invention relates to the inspection of wire bonds for semiconductor devices.

BACKGROUND OF THE INVENTION

To facilitate discussion, FIG. 1 is a schematic illustration of a wire bonding system 100 that may be used in the wire bonding process. A host server 102 is connected to an Ethernet network 104. The Ethernet network 104 is connected to a first host PC 106, a second host PC 108, an Ethernet hub 110, a third host PC 114, and a fourth host PC 116. A Behavioral-Based Equipment Models (B-BEM) adapter program 112 is run on the Autoline controller 126, manufactured by ESEC of Switzerland. The B-BEM adapter program 112 acts like a driver on the Autoline controller 126 to control the wire bonders. The first host PC 106 is connected to a first wire bonder 120, which is a stand alone wire bonder through an RS232 connection. The second host PC 108 is connected to a second wire bonder 122, which is also a stand alone wire bonder through an RS232 connection. The Ethernet hub 110 is connected to the Ethernet network 104, the Autoline controller 126 and a Xyplex server 124, which is sold by iTouch Communications of Littleton, Mass. and the Autoline controller 126. The Xyplex server 124 is connected to a third wire bonder 128 and a fourth wire bonder 130 through RS232 connections. The third and fourth wire bonders 128, 130 are Autoline wire bonders. The host PC's are able to communicate to the wire bonders using SEMI Equipment Communication Stardard (SECS). Other WAN, LAN, and standalone system combinations using different protocols may be used to allow a PC to monitor the schedule and processing of a wire bonder.

The first and second host PC's 106, 108 communicate with the first and second wire bonders 120, 122 respectively directly through the RS232 connections. The third and fourth host PC's 114, 116 sends messages to the third and fourth wire bonders 128, 130 respectively through the Ethernet hub to the Autoline controller 126, which gates the messages through the Ethernet hub to the Xyplex server 124 and then to the third and fourth wire bonders 128, 130. A reverse path is used by the third and fourth wire bonders 128, 130 to send messages back to the third and fourth host PC's 114, 116, respectively.

The host PC's 106, 108, 114, 116 are used to perform analysis for the wire bonders for performance checking and to control the wire bonders 120, 122, 128, 130 and to provide lot management.

To provide instructions for wire bonding a semiconductor chip, a master recipe may first be created for the semiconductor chip. The master recipe specifies the location of each wire bond. Such specification may provide an (x,y) rectangular coordinate for each wire bond. This master recipe may be created and managed by team of qualified recipe administrators. The master recipe is copied to the wire bonders. Since the wire bonders may have an offset, the wire bonders must be "taught" to compensate for the offset when the bonders are placed in a teaching mode. The offset may be a combination of a translational and rotational shift. The teaching of a wire bonder causes the creation of a slave recipe, which is a combination of the master recipe and the offset particular to the individual wire bonder. Sometimes slave recipes for one wire bonder are used as a starting point recipe for another wire bonder.

In a wire bond process, with the rise of number of bonding wires and bonding diagram complexity, bond program verification after teaching becomes the more and more tedious and time-consuming job. Bond recipe, once created, might be distributed to and re-used on multiple wire bonders for bonding the same device. Human mistakes could be made on the bond position definition during the offset teaching when the original bond recipe is re-used on the other bonders. Subsequently any teaching related mistake could cause very heavy yield loss if the wrong recipe is used and the mistake remains unchecked.

Two traditional methods had been used before for ensuring the rightness of bond program. The first method is to stipulate second party verification procedure after each bond program offset teaching. The verification may be done manually based on the certified bonding diagram on the paper. Obviously this method is neither effective nor productive, in the sense that it still heavily relies on the human judgment and is also very time-consuming. The second method is to make use of the 'limited teach function' feature provided by the wire bond equipment itself. This approach is to restrict the change of bond positions within a predefined limited range area. A password may be used to protect the limit setting. This method again is ineffective in terms of the security control.

It would be desirable to provide an automated bond program verification method.

SUMMARY OF THE INVENTION

To achieve the foregoing and other objects and in accordance with the purpose of the present invention, a method for checking a wire bonding recipe is provided. Generally, coordinate data of a master recipe is stored. Coordinate data of a slave recipe is stored. The coordinate data of the slave recipe is compared with coordinate data of the master recipe. An error signal is provided if a mismatch is found between the coordinate data of the slave recipe and the coordinate data of the master recipe.

The invention also provides a computer readable medium containing program instructions for checking a wire bonding recipe. The program contains computer readable code for storing coordinate data of a master recipe, computer readable code for storing coordinate data of a slave recipe, computer readable code for comparing the coordinate data of the slave recipe with coordinate data of the master recipe, and computer readable code for providing an error signal if a mismatch is found between the coordinate data of the slave recipe and the coordinate data of the master recipe.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well-known process steps and/or structures have not been described in detail in order to not unnecessarily obscure the present invention.

Figure 1:
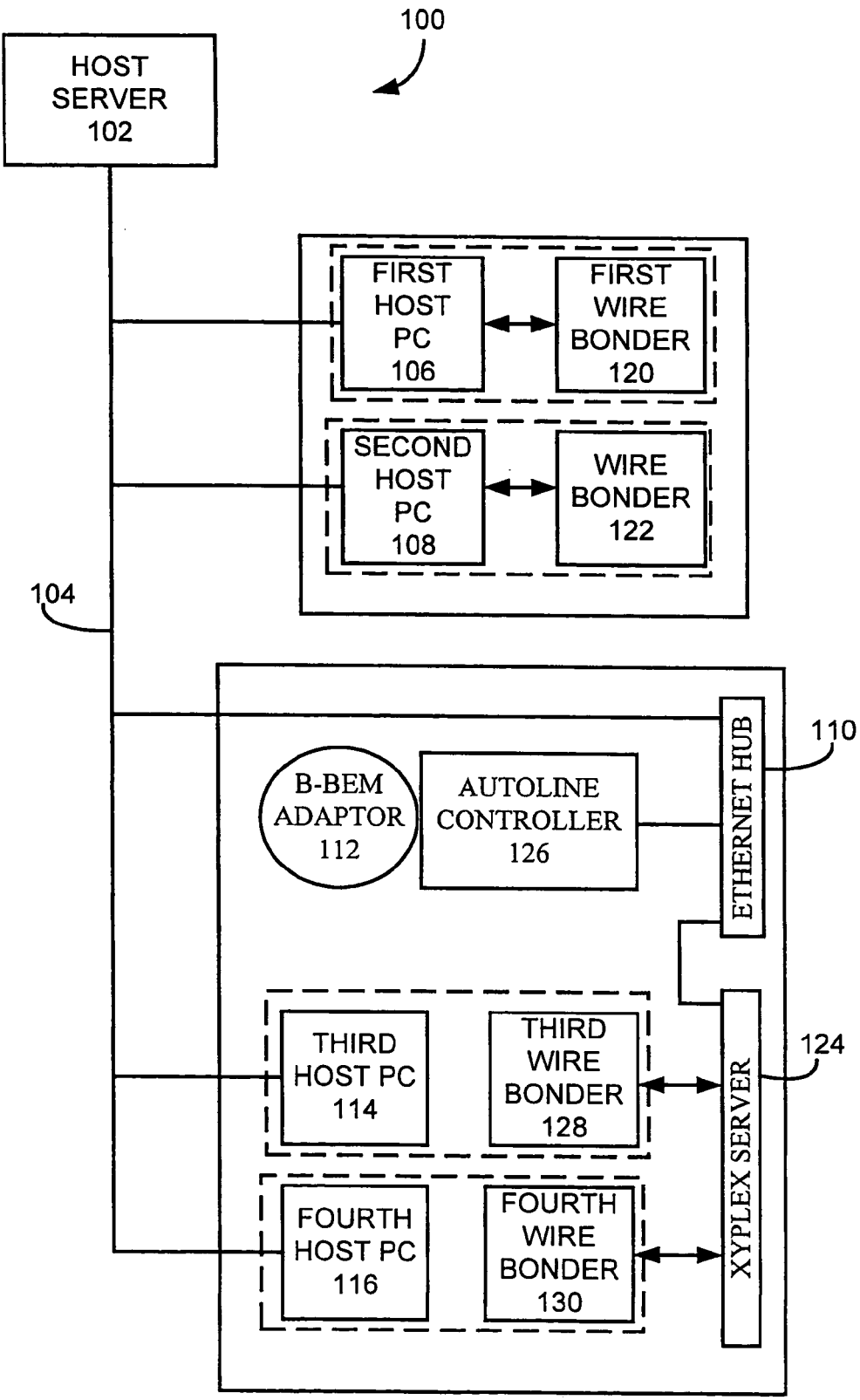
FIG. 1 is a schematic illustration of a wire bonding system 100 that may be used in the wire bonding process.
Figure 2:
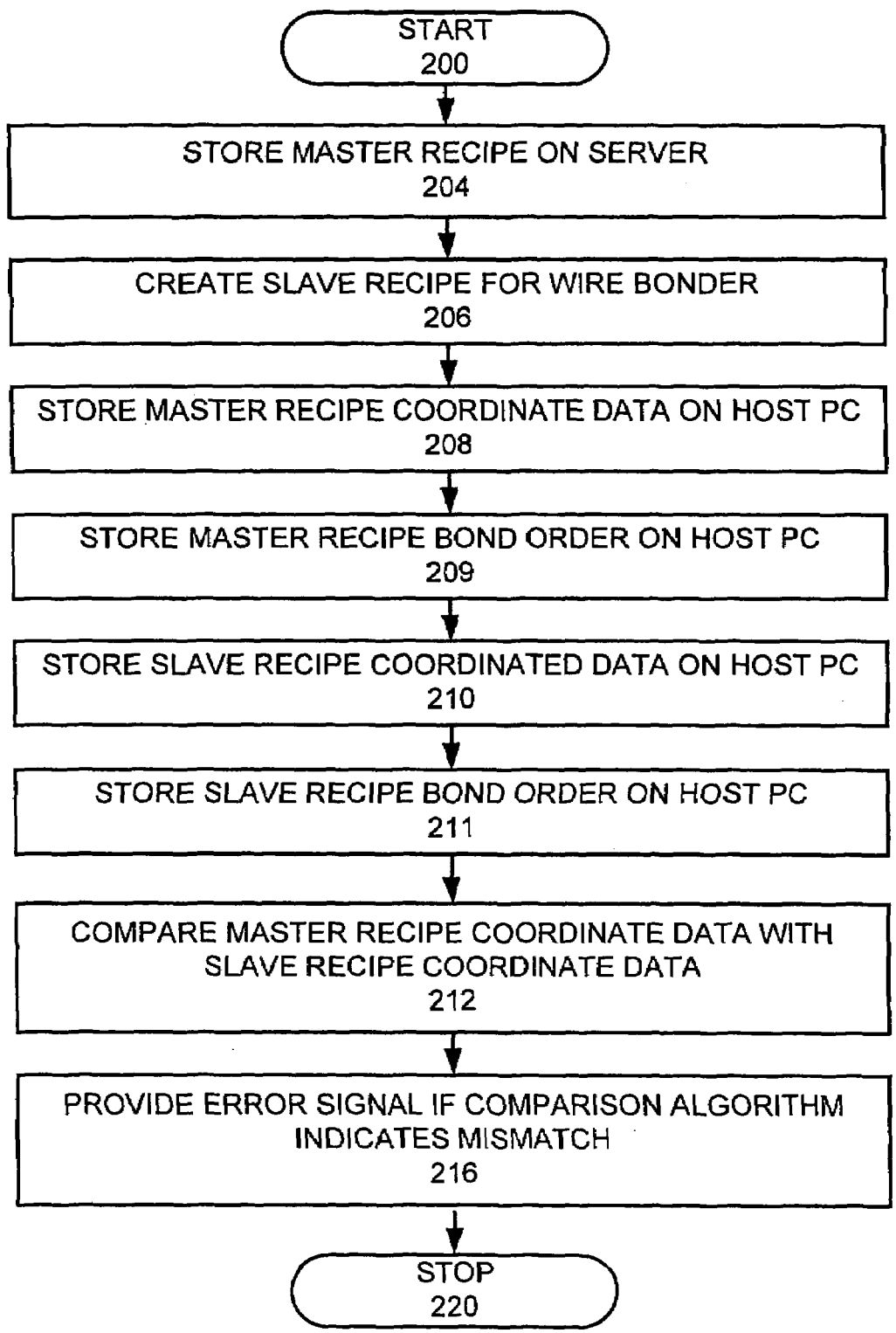
FIG. 2 is a flow chart of part of the operation of a wire bonding system.

FIG. 2 is a flow chart of part of the operation of a wire bonding system, such as the wire bonding system 100, shown in FIG. 1, which may be implemented by computer readable code provided to the wire bonding system 100. A master recipe is stored on the host server 102 (step 204). The master recipe may be created and managed by a team of qualified recipe administrators. A proper authorization may be required to change the master recipe. Host PC's 106, 108, 114, 116 may be able to access the master recipe without changing it. The first, second, third, and fourth wire bonders 120, 122, 128, 130 use the master recipe and information to compensate for an individual wire bonder to create a slave recipe for each wire bonder (step 206). The information to compensate for an individual wire bonder may be provided by a "teach" program where an operator performs actions to compensate for an individual bonder's offset. The teach function may be used to provide a combination of translational and rotational offsets from the master recipe to a slave recipe for a wire bonder. A host PC for an individual bonder receives and stores coordinate data for the master recipe (step 208). Such coordinate data may be the (x,y) coordinates for wire bonds in the master recipe. For example, the first host PC 106 would obtain and store coordinate data for the master recipe. The first host PC 106 would also receive and store bond order data for the master recipe (step 209).

Bond order data is information on the order in which the wire bonds of the coordinate data are made. Depending how the coordinate data and bond order data are represented, the steps of receiving and storing the coordinated data and bond order data for the master recipe may be done simultaneously or sequentially. The first host PC 106 would then obtain and store coordinate data for the slave recipe of the first wire bonder 120 (step 210). The first host PC 106 would also obtain and store bond order data for the slayer recipe (step 211). Bond order data is information on the order in which the wire bonds of the coordinate data are made. Depending how the coordinate data and bond order data are represented, the steps of obtaining and storing the coordinated data and bond order data for the slave recipe may be done simultaneously or sequentially. The first host PC 106 would use a comparison algorithm to compare the coordinate data of the master recipe with the coordinate data of the slave recipe (step 212). If the comparison algorithm indicates a mismatch, an error signal is provided (step 216).

Different algorithms may be used in various embodiments of the invention. In the preferred embodiment of the invention, a first algorithm is used if the wire bonding is a ball bond and a second algorithm is used if the wire bonding is a wedge bond.

Ball Bond

Figure 3:
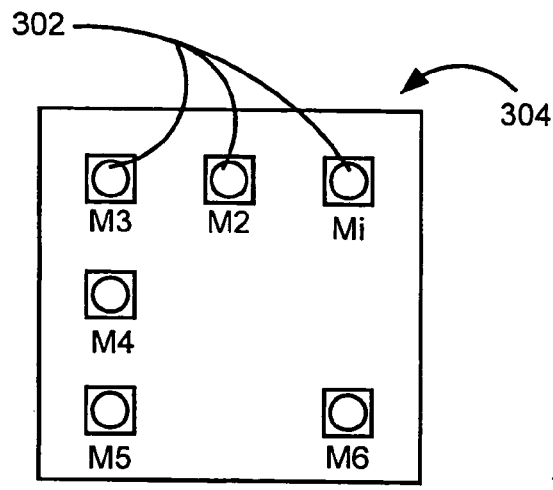
FIG. 3 is a schematic illustration of a ball bond mapping generated by a master recipe.

FIG. 3 is a schematic illustration of a ball bond mapping generated by a master recipe. The master recipe specifies the positions of a plurality of bond locations 302 on a master bond map 304. The bond locations are numbered Mi, M2, M3, M4, M5, M6. The map may have any number of bond locations. Many current chips require more than 680 bond locations.

Figure 4:
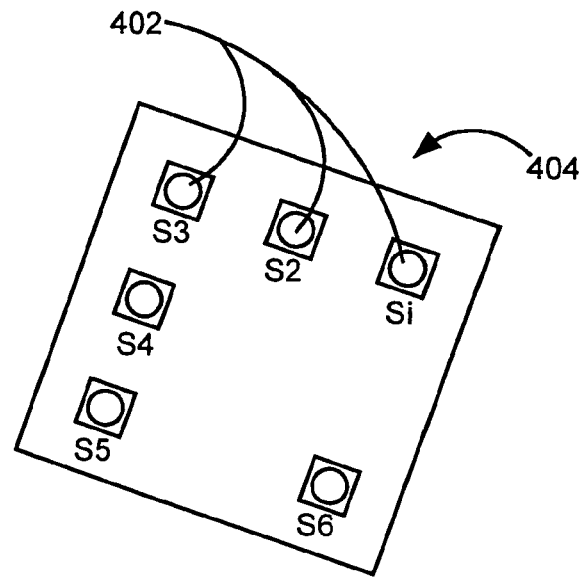
FIG. 4 is a schematic illustration of a ball bond mapping generated by a slave recipe.

FIG. 4 is a schematic illustration of a ball bond mapping generated by a slave recipe. The slave recipe specifies the location of a plurality of bond locations 402 on a slave bond map 404. The bond locations are numbered Si, S2, S3, S4, S5, S6. The map may have any number of bond locations according to the number of bond locations of the related master recipe.

As discussed above, a host PC receives and stores the coordinate data of the master recipe from the host server (step 208). If the master recipe has n bond positions, then the coordinate data of the master recipe may by specified as:

$$M_1(x_1,y_1), \ldots, M_i(x_i,y_i), \ldots, M_j(x_j,y_j), \ldots, M_n(x_n, y_n).$$

By providing the host PC with only the coordinate data of the master recipe, as in the preferred embodiment, the processing performed by the host PC may be reduced, since the host PC would not need to process the master recipe to obtain the coordinate data.

Likewise, the host PC receives and stores the coordinate data of the slave recipe from the wire bonder (step 210). The coordinate data may be received by having the host PC generate the coordinate data from the slave recipe. The slave recipe would also have n bond positions, so that the coordinate data of the slave recipe may be specified as:

$$S_1(x_1',y_1'), \ldots, S_i(x_i',y_i'), \ldots, S_j(x_j',y_j'), \ldots, S_n(x_n', y_n').$$

In addition, in the preferred embodiment, it is desirable that the bond order of the coordinate data from the master recipe and bond order of the coordinate data for the slave recipe is also received by the host PC.

Figure 6:
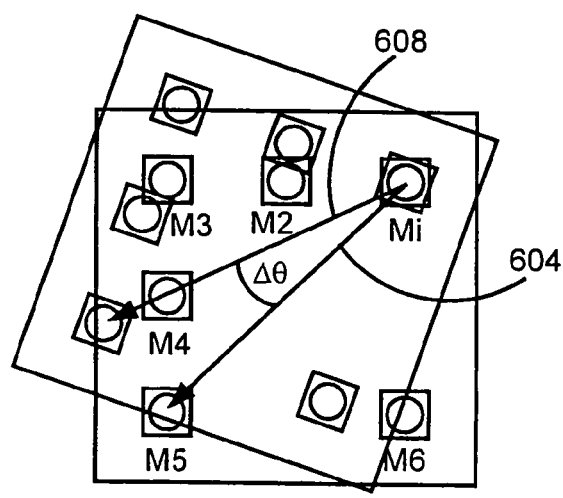
FIG. 6 illustrates the translated slave recipe with the master recipe.
Figure 5:
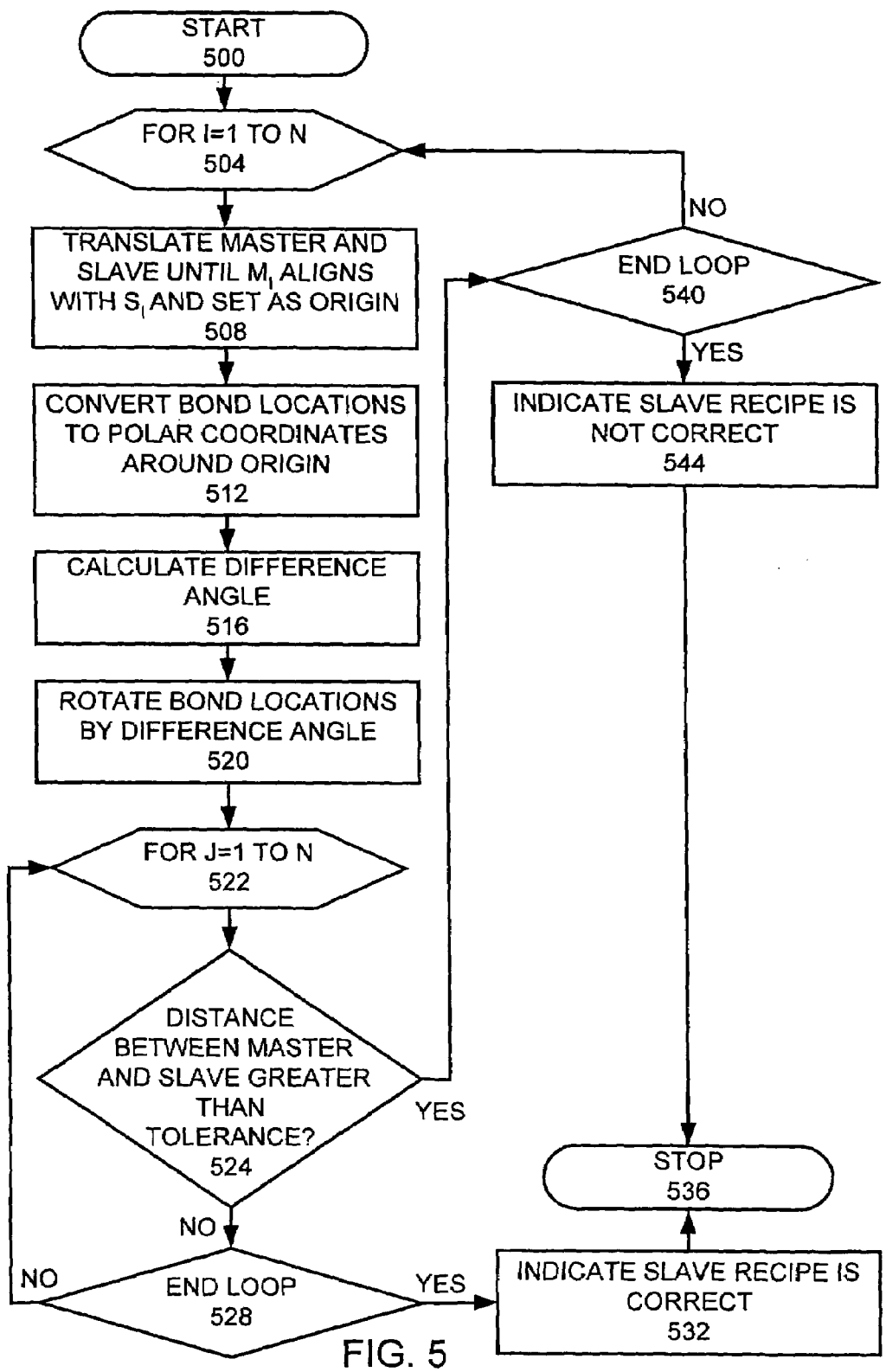
FIG. 5 is a flow chart of an algorithm used to check a slave recipe for a ball bond.

FIG. 5 is a flow chart of an algorithm used to check a slave recipe for a ball bond. This checking may be performed after exiting a teach process. It is assumed that the bond order for the master recipe and the slave recipe are the same. In a loop, position i is chosen as a reference point (step 504). A data shifting operation is carried out to make the position i the origin with zero XY coordinates, For master recipe, X offset: $\Delta_{mx} = -x_i$ Y offset: $\Delta_{my} = -y_i$ $M_1(x_1+\Delta_{mx}, y_1+\Delta_{my}), \ldots, M_i(0,0), \ldots, M_j(x_j+\Delta_{mx}, y_j+\Delta_{my}), \ldots, M_n(x_n+\Delta_{mx}, y_n+\Delta_{my})$ For slave recipe, X offset: $\Delta_{sx} = -x_i'$ Y offset: $\Delta_{sy} = -y_i'$ $S_1(x_1'+\Delta_{sx}, y_1'+\Delta_{sy}), \ldots, S_i(0,0), \ldots, S_j(x_j'+\Delta_{sx}, y_j'+\Delta_{sy}), \ldots, S_n(x_n'+\Delta_{sx}, y_n'+\Delta_{sy})$ This provides a translation in the x,y directions in order to align $M_i$ with $S_i$ (step 508), as shown in FIG. 6.

Next the coordinates are converted from XY coordinates to a polar coordinate reference system (step 512) in order to carry out data rotating operation, $M_1(\rho_1, \theta_1), \ldots, M_i(0,0), \ldots, M_j(\rho_j, \theta_j), \ldots, M_n(\rho_n, \theta_n)$ $S_1(\rho_1', \theta_1'), \ldots, S_i(0,0), \ldots, S_j(\rho_j', \theta_j'), \ldots, S_n(\rho_n', \theta_n')$ A difference angle between the corresponding master and slave vectors is calculated (step 516). For example, for vector $M_j(\rho_j, \theta_j)$ (from $M_i(0,0)$ to $M_j(\rho_j, \theta_j)$) and vector $S_j(\rho_j', \theta_j')$ (from $S_i(0,0)$ to $S_j(\rho_j', \theta_j')$) the difference angle is calculated as:

$\Delta_\theta = \theta_j - \theta_j'$

The difference angle may be calculated as the difference between a single master vector and a single slave vector, as shown, or may be calculated as an average the differences between several master vectors and slave vectors or by some other combination. FIG. 6 illustrates vector $M_5(\rho_5, \theta_5)$ 604 and vector $S_5(\rho_5, \theta_5)$ 608 and a difference angle $\Delta\theta$ therebetween.

The bond locations are then rotated by the difference angle (520) to match up the bond locations of the master recipe with bond locations of the slave recipe. This may be done by either rotating the master bond locations or the slave bond locations, or some combination. For example, every vector of the slave recipe rotated by the difference angle $\Delta_\theta$, as shown, $S_1(\rho_1', \theta_1'+\Delta_\theta), \ldots, S_i(0,0), \ldots, S_j(\rho_j', \theta_j'+\Delta_\theta), \ldots, S_n(\rho_n', \theta_n'+\Delta_\theta)$ A second loop is begun for bond locations 1 to n (step 522). For each bond location the distances between corresponding master and slave vectors from the master and slave recipes are measured. An example algorithm would be:

Loop For i=1 To n
If $|M_i(\rho_i, \theta_i) - S_i(\rho_i', \theta_i+\Delta_\theta)| >$ Tolerance Then select new origin locations;
End Loop;

Thus coordinate data of the slave recipe $S_i$ with a bond order of the slave recipe of i is compared with coordinate data of the master recipe $M_i$ with a matching bond order of the master recipe of i, so that bond locations with matching bond orders are compared. If this verification process shows no failure, system will confirm the slave recipe is correct.

If this verification process shows a failure, the algorithm will choose another point other than i as the new reference (step 540) and go through the whole data operation process again from the step of choosing a reference point (step 504). If the result still fails after all the points have been used as the reference (step 540), system will confirm the failure result and prompt user the alarm as well as shut down the bonder from executing (step 544). This step is to overcome the false alarm caused by over shifting of reference point i.

Figure 10:
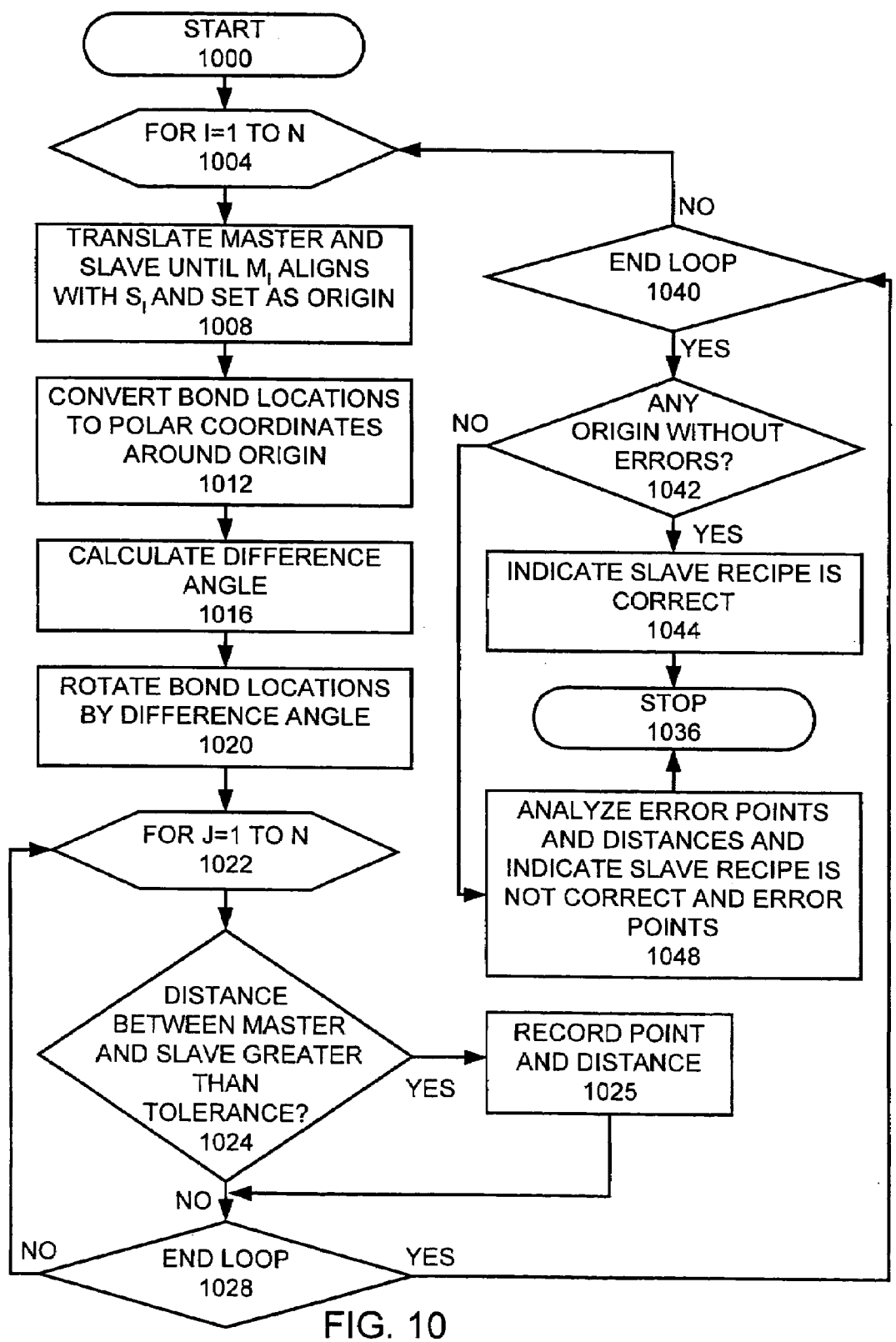
FIG. 10 is a flow chart of an algorithm used in another embodiment of the invention.

FIG. 10 is a flow chart of another preferred embodiment for a ball bond process, that is similar to the above mentioned process. In a loop, position i is chosen as a reference point (step 1004). A data shifting operation is carried out to make the position i the origin with zero XY coordinates, For master recipe, X offset: $\Delta_{mx} = -x_i$ Y offset: $\Delta_{my} = -y_i$ $M_1(x_1+\Delta_{mx}, y_1+\Delta_{my}), \ldots, M_i(0,0), \ldots, M_j(x_j+\Delta_{mx}, y_j+\Delta_{my}), \ldots, M_n(x_n+\Delta_{mx}, y_n+\Delta_{my})$ For slave recipe, X offset: $\Delta_{sx} = -x_i'$ Y offset: $\Delta_{sy} = -y_i'$ $S_1(x_1'+\Delta_{sx}, y_1'+\Delta_{sy}), \ldots, S_i(0,0), \ldots, S_j(x_j'+\Delta_{sx}, y_j'+\Delta_{sy}), \ldots, S_n(x_n'+\Delta_{sx}, y_n'+\Delta_{sy})$ This provides a translation in the x,y directions in order to align $M_i$ with $S_i$ (step 1008), as shown in FIG. 6.

Next the coordinates are converted from XY coordinates to a polar coordinate reference system (step 512) in order to carry out data rotating operation, $M_1(\rho_1, \theta_1), \ldots, M_i(0,0), \ldots, M_j(\rho_j, \theta_j), \ldots, M_n(\rho_n, \theta_n)$ $S_1(\rho_1', \theta_1'), \ldots, S_i(0,0), \ldots, S_j(\rho_j', \theta_j'), \ldots, S_n(\rho_n', \theta_n')$ A difference angle between the corresponding master and slave vectors is calculated (step 1016). For example, for vector $M_j(\rho_j, \theta_j)$ (from $M_i(0,0)$ to $M_j(\rho_j, \theta_j)$) and vector $S_j(\rho_j', \theta_j')$ (from $S_i(0,0)$ to $S_j(\rho_j', \theta_j')$) the difference angle is calculated as:

$\Delta_\theta = \theta_j - \theta_j'$

The difference angle may be calculated as the difference between a single master vector and a single slave vector, as shown, or may be calculated as an average the differences between several master vectors and slave vectors or by some other combination. FIG. 6 illustrates vector $M_5(\rho_5, \theta_5)$ 604 and vector $S_5(\rho_5, \theta_5)$ 608 and a difference angle $\Delta\theta$ therebetween.

The bond locations are then rotated by the difference angle (1020) to match up the bond locations of the master recipe with bond locations of the slave recipe. This may be done by either rotating the master bond locations or the slave bond locations, or some combination. For example, every vector of the slave recipe rotated by the difference angle $\Delta_\theta$, as shown, $S_1(\rho_1', \theta_1'+\Delta_\theta), \ldots, S_i(0,0), \ldots, S_j(\rho_j', \theta_j'+\Delta_\theta), \ldots, S_n(\rho_n', \theta_n'+\Delta_\theta)$ A second loop is begun for bond locations 1 to n (step 1022). For each bond location the distances between corresponding master and slave vectors from the master and slave recipes are measured. An example algorithm would be:

Loop For i=1 To n

If $|M_i(\rho_i,\theta_i)-S_i(\rho_i', \theta_i+\Delta_\theta)|>$Tolerance Then record location and distance;

End Loop;

Thus coordinate data of the slave recipe $S_i$ with a bond order of the slave recipe of i is compared with coordinate data of the master recipe $M_i$, with a matching bond order of the master recipe of i, so that bond locations with matching bond orders are compared. If this verification process shows no failure, system in this embodiment continues to choose another point for an origin until all bond locations have been used as an origin (step 1040).

If this verification process shows a failure, the algorithm will record the bond location of the error and the distance of error (step 1025) and will then continue to measure errors for the remaining bond locations until the error is measured for all bond locations (step 1028). When all errors for bond locations around the origin are measured (step 1028) a determination is made whether or not all bond locations have been used as an origin (step 1040) if not, another point other than i as the new reference origin (step 1004) and go through the whole data operation process again from the step of choosing a reference point (step 1004). Once all of the bond locations have been used as origins a determination is made whether any origins had zero errors (step 1042). If an origin is found without any errors an indicator provides a signal that the slave recipe is correct (step 1044). If all origins have a error location then an analysis is made of the error locations to determine which locations are wrong in the slave recipe and an output is provided that indicates that the slave recipe is not correct and which bond locations are not correct (step 1048).

By providing as output bond locations that are not correct and even the amount of error of such bond locations, this embodiment allows a user to more easily correct the slave recipe or verify the results of the algorithm.

Other embodiments may use a mixture of the two processes, such as in a process similar to the process in FIG. 10, using a flag to immediately indicate if the slave recipe is correct, without using all bond locations as origins.

Wedge Bond

Figure 7:
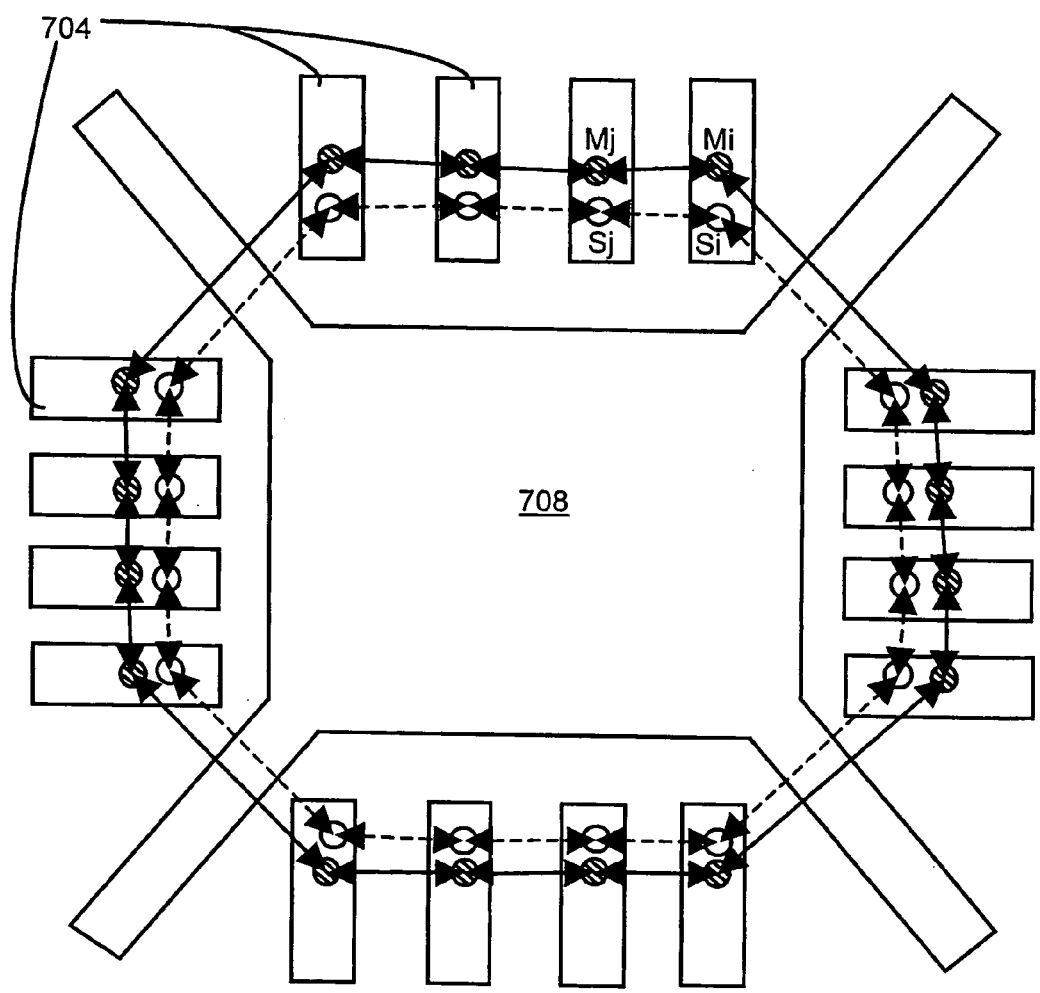
FIG. 7 is a schematic illustration of a profile of lead fingers and a die attach pad of a lead frame that is used for wedge bonding.

To facilitate understanding FIG. 7 is a schematic illustration of a profile of lead fingers 704 and a die attach pad 708 of a lead frame that uses wedge bonding. Wedge bonds may be placed along the lead frame finger. Since a wedge bond placed at one of various locations along a lead frame finger would yield an acceptable wedge bond, the tolerance along the direction of the lead frame finger for a wedge bond would be greater than the tolerance for a ball bond. As a result the algorithm used for ball bond verification may cause too many false alarms when analyzing wedge bonds. Hence a different algorithm may be used for the verification of wedge bonds.

In the wedge bond algorithm a comparison is made on the neighboring wedge bond positions between the master and slave recipe, which are neighboring bond positions. For example, as shown in FIG. 7, Mi, Mj are the two neighboring wedge bond positions for neighboring bond positions on the master recipe, while Si, Sj are the two neighboring wedge bond positions on the slave recipe. |MiMj| denotes the distance between Mi and Mj while |SiSj| denotes the distance between Si and Sj. The verification algorithm may be done as follows, Loop For i=0 to n
   If (|MiMj|−|SiSj|)>Tolerance Then a) Trigger alarm message and b) shut down the bonder from executing;

End Loop;

Compared to the algorithm used on ball bond verification, the advantage of this algorithm is that it controls bond position lateral shifting (moving across the lead finger which causes wrong bonding) more strictly than it controls bond position vertical shifting (moving along the lead finger which doesn't cause wrong bonding). This way, the more flexibility on wedge bond position adjustment can be obtained, while incorrect bond position teaching is still under the control.

This algorithm is based on the assumption that slave bond locations are spaced relative to each other based on how master bond locations are spaced relative to each other.

Tolerance Settings

Tolerance setting should always be optimized according to the die pad and lead finger dimensions and spacing as an over loosened tolerance might miss faulty slave recipes, while the over tightened tolerance might induce too many false alarms.

Host PC

Figure 8:
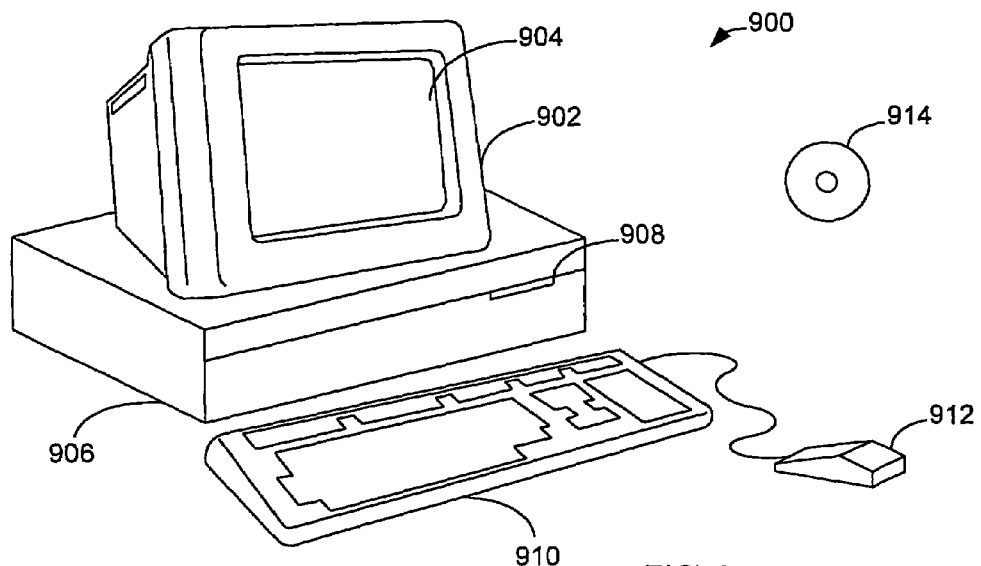
FIG. 8 illustrates one possible physical form of a computer system.
Figure 9:
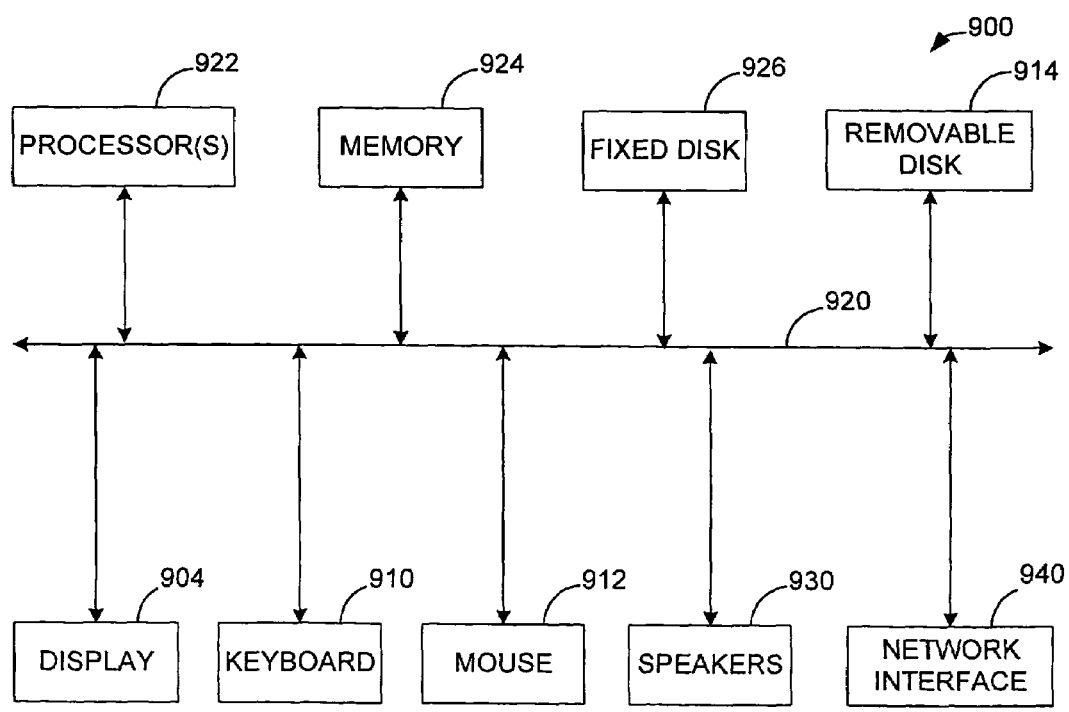
FIG. 9 is an example of a block diagram for the computer system illustrated in FIG. 8.

FIGS. 8 and 9 illustrate one possible physical form of a computer system (host PC). Of course, the computer system may have many physical forms ranging from an integrated circuit, a printed circuit board, and a small handheld device up to a huge super computer. Computer system 900 includes a monitor 902, a display 904, a housing 906, a disk drive 908, a keyboard 910, and a mouse 912. Disk 914 is a computer-readable medium used to transfer data to and from computer system 900.

FIG. 9 is an example of a block diagram for computer system 900. Attached to system bus 920 are a wide variety of subsystems. Processor(s) 922 (also referred to as central processing units, or CPUs) are coupled to storage devices, including memory 924. Memory 924 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable of the computer-readable media described below. A fixed disk 926 is also coupled bi-directionally to CPU 922; it provides additional data storage capacity and may also include any of the computer-readable media described below. Fixed disk 926 may be used to store programs, data, and the like and is typically a secondary storage medium (such as a hard disk) that is slower than primary storage. It will be appreciated that the information retained within fixed disk 926 may, in appropriate cases, be incorporated in standard fashion as virtual memory in memory 924. Removable disk 914 may take the form of any of the computer-readable media described below.

CPU 922 is also coupled to a variety of input/output devices, such as display 904, keyboard 910, mouse 912 and speakers 930. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 922 optionally may be coupled to another computer or telecommunications network using network interface 940. With such a network interface, it is contemplated that the CPU might receive information from the network, or might output information to the network in the course of performing the above-described method steps.

Furthermore, method embodiments of the present invention may execute solely upon CPU 922 or may execute over a network such as the Internet in conjunction with a remote CPU that shares a portion of the processing.

In addition, embodiments of the present invention further relate to computer storage products with a computer-readable medium that have computer code thereon for performing various computer-implemented operations. The media and computer code may be those specially designed and constructed for the purposes of the present invention, or they may be of the kind well known and available to those having skill in the computer software arts. Examples of computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level code that are executed by a computer using an interpreter.

In another embodiment, a computer providing the inventive automated analysis may provide such analysis for more than one wire bonder.

While this invention has been described in terms of several preferred embodiments, there are alterations, modifications, permutations, and substitute equivalents, which fall within the scope of this invention. It should also be noted that there are many alternative ways of implementing the methods and apparatuses of the present invention. It is therefore intended that the following appended claims be interpreted as including all such alterations, permutations, and substitute equivalents as fall within the true spirit and scope of the present invention.

What is claimed is:

1. A method for checking a wire bonding recipe, comprising:
   storing coordinate data of a master recipe;
   storing coordinate data of a slave recipe;
   comparing the coordinate data of the slave recipe with coordinate data of the master recipe; and
   providing an error signal if a mismatch is found between the coordinate data of the slave recipe and the coordinate data of the master recipe.

2. The method, as recited in claim 1, further comprising;
   storing the bond order for the master recipe; and
   storing the slave recipe, wherein the comparing the coordinate data, compares the coordinate data according to the bond order for the master recipe and the bond order for the slave recipe.

3. The method, as recited in claim 2, further comprising receiving coordinate data of the master recipe and bond order for the master recipe from a host server, and wherein the slave recipe is a slave recipe for a wire bonder.

4. The method, as recited in claim 3, wherein the comparing coordinate data of the slave recipe with coordinate data of the master recipe comprises comparing coordinate data of the slave recipe of a bond order of the slave recipe with coordinate data of the master recipe with a matching bond order of the master recipe.

5. The method, as recited in claim 2, wherein the comparing coordinate data, comprises:
   translating the coordinate data, so that a bond position of the slave recipe is at the same location as a bond position of the master recipe with a matching bond order, so that the location becomes an origin location;
   finding a difference angle between the slave recipe and the master recipe; and
   rotating a plurality of bond positions with bond orders around the origin location; and
   determining distances between the plurality of rotated bond positions and bond positions with matching bond orders.

6. The method, as recited in claim 5, wherein the comparing coordinate data, further comprises:
   determining if the determined distances are greater than a threshold;
   providing an correct signal if none of the determined distances is greater than the threshold;
   providing that if any of the determined distances is greater than the threshold, then comprising:
      translating the coordinate data, so that a second bond position of the slave recipe is at the same location as a bond position of the master recipe with a matching bond order, so that the location becomes a new origin location;
      finding a difference angle between the slave recipe and the master recipe around the new origin location;
      rotating a plurality of bond positions with bond orders around the new origin location; and
      determining a second set of distances between the plurality of rotated bond positions and bond positions with matching bond orders.

7. The method, as recited in claim 6, wherein the providing that if any of the determined distances greater than the threshold, further comprising:
   determining if the determined second set of distances are greater than a threshold;
   providing a correct signal if none of the determined second set of distances is greater than the threshold; and
   providing that if any of the determined distances is greater than the threshold indicating that the slave recipe is not correct.

8. The method, as recited in claim 2, wherein the comparing coordinate data, comprises:
   determining distances between neighboring bond positions of the master recipe;
   determining distances between neighboring bond positions of the slave recipe; and
   determining differences between distances between neighboring bond positions of the master recipe and the distances between neighboring bond positions with matching bond orders of the slave recipe.

9. The method, as recited in claim 8, wherein the comparing coordinate data, further comprises:
   determining if the determined distances is greater than a threshold; and
   providing a correct signal if none of the determined distances is greater than the threshold.

10. The method, as recited in claim 1, further comprising indicating incorrect bond locations of a slave recipe.

* * * * *